(12) United States Patent
Steger et al.

(10) Patent No.: US 9,320,182 B2
(45) Date of Patent: Apr. 19, 2016

(54) MODULAR LIQUID-COOLED POWER SEMICONDUCTOR MODULE, AND ARRANGEMENT THEREWITH

(71) Applicant: Semikron Elektronik GmbH & Co., KG, Nürnberg (DE)

(72) Inventors: Jürgen Steger, Hiltpolstein (DE); Markus Knebel, Tuchenbach (DE); Peter Beckedahl, Oberasbach (DE); Andreas Maul, Nürnberg (DE); Susanne Kalla, Ebermannsdorf (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 234 days.

(21) Appl. No.: 13/865,177

(22) Filed: Apr. 17, 2013

(65) Prior Publication Data

US 2013/0271916 A1 Oct. 17, 2013

(30) Foreign Application Priority Data

Apr. 17, 2012 (DE) .......................... 10 2012 206 264

(51) Int. Cl.
| | |
|---|---|
| *H01L 23/40* | (2006.01) |
| *H05K 7/20* | (2006.01) |
| *H01H 9/52* | (2006.01) |
| *H01L 23/473* | (2006.01) |
| *H01L 25/11* | (2006.01) |
| *H01H 9/00* | (2006.01) |
| *H01L 25/07* | (2006.01) |

(52) U.S. Cl.
CPC ............ *H05K 7/20927* (2013.01); *H01H 9/52* (2013.01); *H01L 23/40* (2013.01); *H01L 23/4012* (2013.01); *H01L 23/473* (2013.01); *H01L 25/117* (2013.01); *H01L 25/071* (2013.01); *H01L 25/072* (2013.01); *H01L 2924/0002* (2013.01)

(58) Field of Classification Search
CPC ............ H05K 7/2089–7/20945; H01L 23/473; H01L 25/117; H01H 9/52
USPC ........................ 361/679.46–679.54, 688–723; 165/80.4, 80.5, 104.33; 257/714
See application file for complete search history.

(56) References Cited

U.S. PATENT DOCUMENTS

| | | | | |
|---|---|---|---|---|
| 4,841,355 | A  * | 6/1989 | Parks ............................. | 257/686 |
| 7,190,070 | B2 | 3/2007 | Manz | |
| 7,200,007 | B2 * | 4/2007 | Yasui et al. ................... | 361/716 |
| 7,254,030 | B2 * | 8/2007 | Chiba et al. ................... | 361/710 |
| 7,835,151 | B2 * | 11/2010 | Olesen ........................... | 361/689 |
| 7,952,875 | B2 * | 5/2011 | Woody et al. ................. | 361/699 |

(Continued)

*Primary Examiner* — Zachary M Pape
(74) *Attorney, Agent, or Firm* — The Law Offices of Roger S. Thompson

(57) ABSTRACT

A power semiconductor module, and an arrangement using the module. The module has a basic parallelepipedal shape with opposed pairs of main, longitudinal and narrow sides, a cooling device which is capable of carrying a flow of a cooling fluid, having a power electronics switch and a housing. The cooling device has a cooling volume with at least one cooling face and four connection devices which are arranged in pairs on the main sides. In addition, the connection devices carry the cooling fluid and are designed as a flow inflow and a flow outflow and as a return inflow and a return outflow, respectively. The power electronics switch has load input connection devices and load output connection devices which are arranged on one or both longitudinal sides and a control connection device which is arranged on a narrow side of the module.

16 Claims, 4 Drawing Sheets

(56) References Cited

U.S. PATENT DOCUMENTS

| | | | |
|---|---|---|---|
| 8,149,579 B2 * | 4/2012 | Jadric et al. | 361/699 |
| 8,421,235 B2 * | 4/2013 | Ide et al. | 257/773 |
| 2007/0044952 A1 * | 3/2007 | Kuno et al. | 165/287 |
| 2014/0293552 A1 * | 10/2014 | Bogen et al. | 361/728 |

* cited by examiner

MODULAR LIQUID-COOLED POWER SEMICONDUCTOR MODULE, AND ARRANGEMENT THEREWITH

BACKGROUND OF THE INVENTION

1. Field of the Invention

The invention relates to a power semiconductor module particularly suitable for use in local power supply devices. For this purpose, the power semiconductor module is provided with a fluid cooling device and is designed such that a plurality of these power semiconductor modules can be strung together in modular fashion by connecting their flows and returns. As a result of this stringing-together, an arrangement is obtained which can be used as an inverter circuit in wind power installations, for example.

2. Description of the Related Art

Modular power semiconductor modules are known, by way of example from U.S. Pat. No. 7,190,070. The power semiconductor modules, which are called submodules therein, have a housing and load and auxiliary connections. The power semiconductor modules can be arranged next to one another on a cooling device and are connected by means of a connecting device to form an overall arrangement.

In addition, U.S. Pat. No. 7,835,151 discloses continuous-flow distribution modules and an arrangement comprising the latter. In this case, the continuous-flow distributor module has a housing, an inlet distributor, an outlet distributor and a multiplicity of continuous-flow cells as part of a cooling system. These cells may be in the form of open cells, configured to receive a power electronics switch. This produces a face that needs to be sealed between the continuous-flow distributor module and the power electronics switch.

SUMMARY OF THE INVENTION

The object of the invention is to provide an improved modular fluid-cooled power semiconductor module which has no internal seal faces, can be produced flexibly with different power electronics circuits and is externally accessible for simple external connection with a low inductance for the load connections It is a further object of this invention to present an arrangement having a plurality of these power semiconductor modules which realize the advantages thereof.

The inventive power semiconductor module has a basically parallelepipedal shape which defines two main sides, two longitudinal sides and two narrow sides which are opposite one another in respective pairs. In addition, the main sides are defined in that, in relation to the parallelepipedal basic shape, the surface area of the main sides is the largest, while correspondingly the surface area of the narrow sides is the smallest. While retaining the parallelepipedal basic shape, these respective sides are not necessarily completely planar; instead, the faces of the respective sides may have indentations and alternatively or additionally recesses, for example for connection elements.

In addition, the power semiconductor module has a cooling device, which is capable of carrying a flow of a cooling fluid, preferably a cooling liquid, therefor, a power electronic switch and a housing for the module. In this arrangement, the cooling device has four connections for carrying the cooling fluid, and a cooling volume having at least one cooling face. In this case, a cooling volume is intended to mean either a single chamber capable of carrying a flow of the cooling fluid, or a plurality of chambers capable of carrying the flow of the cooling fluid, either in parallel or in series. These chamber(s) form cavities in the cooling device, with at least one cooling face adjoining at least one of these cavities. The at least one cooling face is preferably arranged parallel to the main sides. The cooling volume is impervious towards the respective cooling face. Hence, the interior of the power semiconductor module is free of internal seal faces, which would require the use of internals seals.

The four connections of the cooling device for carrying the cooling fluid are arranged in pairs on the main sides of the power semiconductor module. The connections for the cooling fluid are designed as a flow inflow and a flow outflow and as a return inflow and a return outflow, respectively. In this context, flow is understood to mean that stream which transports the cooling fluid to an article to be cooled, while the return is particularly that stream of fluid which transports the cooling fluid away following the heat transfer from the article to be cooled.

In a first preferred embodiment, the flow inflow and the return outflow, and the flow outflow and the return inflow, are respectively arranged on one main side of the power semiconductor module. In this case, the respective inflows and outflows naturally have associated connection devices which are defined by their function.

In a second preferred embodiment, the flow inflow and the return inflow, and the flow outflow and the return outflow, are respectively arranged on one main side.

Preferably, the cooling device of the power semiconductor module has a first branch between the flow inflow and the flow outflow and a second branch between the return inflow and the return outflow. The two branches are connected, as a result of which the cooling volume of the cooling device is able to carry a flow of cooling fluid from the flow to the return.

The power electronics switch has a power electronics circuit which is arranged on the at least one cooling face and is thermally connected to the cooling fluid by means of the latter, as a result of which it is possible for heat produced to be dissipated to the cooling fluid. It may be preferable for the power electronics circuit to be produced by means of single switching modules. In addition, it may be preferable for these switching modules to be arranged in pairs on two respective cooling faces which are opposite one another in relation to the cooling volume.

In addition, the power electronics switch has load input connection devices and load output connection devices which in each case are arranged on one or both longitudinal sides of the parallelepiped. These load input connection devices and load output connection devices are used for the external connection of the power electronics circuit. It may be advantageous for the load input connection devices to be arranged on a first longitudinal side and for the load output connection devices to be arranged on the opposite longitudinal side.

Equally, the power electronics switch has a control connection device which is arranged on a narrow side of the parallelepiped. This control connection device is used particularly for the external connection of control, error and sensor signals. In this case, the power electronics switch may have not only the power electronics circuit but also a module-internal control circuit which, by way of example, has the secondary side or a portion thereof, for the purpose of actuating the power electronics circuit.

In addition, the power semiconductor module has a housing, which, in a first preferred embodiment, covers exclusively the power electronics circuit, and recesses for the connection devices of the power electronics circuit. In this case, the housing may also be in the form of an encapsulation that is impervious to dust and moisture.

In a second preferred embodiment, the housing is in the form of an encapsulation which is impervious to dust and moisture over the whole power semiconductor module, which encloses the power electronics circuit and the cooling device, with only the necessary connection devices extending through the housing.

The first embodiment of the inventive arrangement comprises a plurality of power semiconductor modules as cited above is in a form such that the flow outflow of a power semiconductor module is connected to the flow inflow, and the return inflow is connected to the return outflow, of the downstream power semiconductor module, either indirectly or directly. In this case, a direct connection is intended to be understood to mean a connection in which the corresponding connection devices are connected directly with the exclusive addition of necessary external seal devices. An indirect connection in this case is intended to be understood to mean a connection in which the corresponding connection devices are connected, not directly, but rather by means of suitable connecting elements and necessary external seals. An external seal in this context is understood to mean a seal which can be arranged on the exterior of the power semiconductor module.

In a second embodiment, the power semiconductor modules are strung together in modular fashion by virtue of the flow outflow of a power semiconductor module being connected to the flow inflow of the downstream power semiconductor module, and the return outflow being connected to the return inflow, of the downstream power semiconductor module indirectly or directly.

In this case, it is preferred in each of the two embodiments if the load input connection devices and the load output connection devices of all the power semiconductor modules are respectively arranged on the same longitudinal side. This is used particularly to externally connect the power semiconductor modules with low inductance. In addition, this keeps the external connection complexity extremely low.

Equally, it may be preferred if the control connection devices of all the power semiconductor modules are respectively arranged on the same narrow side. This is also used for particularly simple external connection, particularly when at least two control connection devices of associated adjacent power semiconductor modules are connected to a common external control board.

If the arrangement is in the form of a polyphase inverter, it may also be advantageous if those power semiconductor modules which have control connection devices connected by means of a common external control board are associated with one electrical phase of the inverter of an AC system. This splitting of the control signals over a plurality of control boards allows the design to be simplified and, alternatively or simultaneously, interference immunity to be increased.

The cited embodiments of the power semiconductor modules and the arrangement constructed therefrom allow the use, in principle, of the same type of power semiconductor modules for different circuit topologies, particularly for two-level and three-level inverters. The modular and flexible embodiment of the power electronics circuits also result in an easily scalable embodiment, as a result of which it is possible for particularly inverters having different powers to have their power scaled just by virtue of the number of power semiconductor modules that are strung together.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
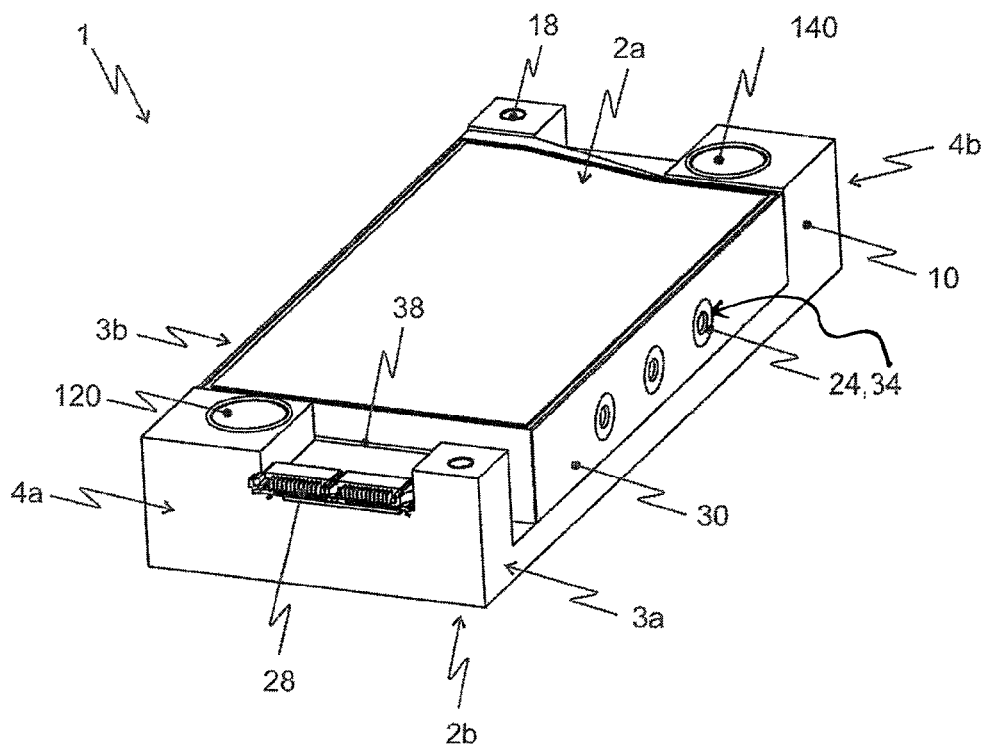
FIG. 1 shows a perspective view of a power semiconductor module which includes the inventive arrangement.
Figure 2:
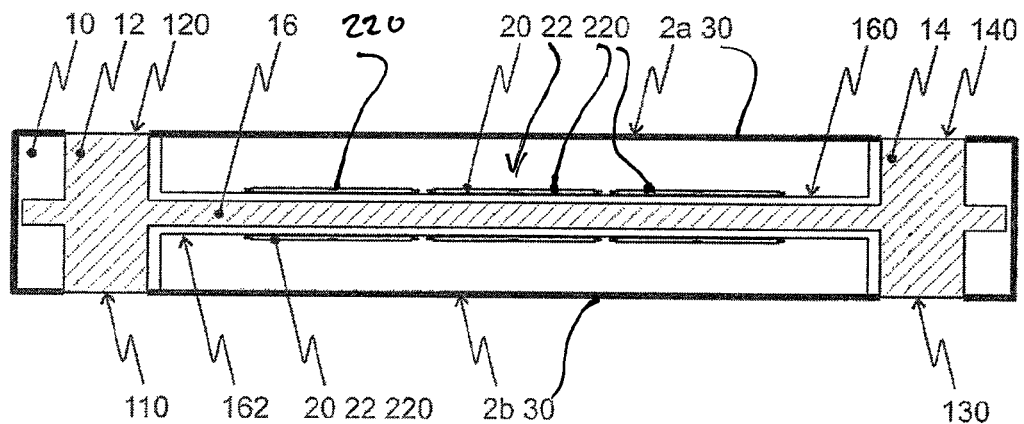
FIG. 2 shows a schematic cross-section through a power semiconductor module which includes the inventive arrangement taken parallel to a longitudinal side thereof.

FIG. 1 shows a perspective view of a power semiconductor module 1 of an arrangement 100 according to the invention (cf., FIG. 6) in which the parallelepipedal basic shape of power semiconductor module 1 is clearly recognizable. Power semiconductor module 1 therefore has two main sides 2a/b (only main side 2a is visible in FIG. 1) on which, in each case closely adjacent to longitudinal sides 3a/b and narrow sides 4a/b, connections 110, 120, 130, 140 for the cooling fluid are arranged in opposite corners (connections 110, 130 are seen in FIG. 2). Connections 110, 120, 130, 140 are part of a U-shaped cooling device 10 of power semiconductor module 1. A flow outflow 120 and a return outflow 140 are shown in first main face 2a, at diagonally opposed corners thereof. The two remaining corners have recesses 18 which penetrate cooling device 10 between main faces 2a/b and which may be used to connect a plurality of power semiconductor modules 1 when the latter are strung together.

FIG. 1 likewise shows a housing 30 for power semiconductor module 1. Housing 30 covers recesses in cooling device 10 and in so doing forms essential portions of first main side 2a. Housing 30 covers a power electronics circuit 22 of power electronics switch 20 of power semiconductor module 1 (FIG. 2). A load connection 24, in this case load output connection, and control connections 26 are visible from power electronics switch 20, on a narrow side thereof. These connections penetrate housing 30 at respectively associated recesses 34, 36. A second load connection corresponding to load connection 24 located in a recess corresponding to recess 34 is on the opposite longitudinal side 3b, but is not visible in the Figures. Corresponding control connections 28 in a recess 38 may be seen in FIG. 2 on narrow side 4b.

FIG. 2 schematically shows a cross-section through power semiconductor module 1 of inventive arrangement 100 from the direction of longitudinal side 3a. In this case, FIG. 2 shows a double-U shaped cooling device 10 with a flow outflow 120 and a return outflow 140 on a first main side 2a, while the respective corresponding flow inflow 110 and the return inflow 130 are arranged on a second main side 2b. The cooling volume 16 capable of carrying the flow of cooling fluid is arranged between the flow 12 and the return 14.

In this case, this cooling volume 16 has a single chamber with two associated cooling faces 160, 162. Switching modules 220 of power electronics circuit are arranged on each of the two cooling faces 160, 162. Two respective switching modules 220 arranged opposite are associated with one phase of a three-phase inverter circuit.

Housing 30 of this power semiconductor module 1 is in the form of an encapsulation which is impervious to dust and moisture and which has exclusively openings, recesses 34, 38 (shown elsewhere), as well as the recesses necessary to accommodate the connections on longitudinal face 3b, for the necessary external connection devices to be passed through, and otherwise surrounds both power electronics circuit 22 and the whole cooling device 10. In this case, the necessary connection devices are the four connection devices 110, 120, 130, 140 for the cooling fluid, the load connection lines 24 (and no shown) and control connection line 28 of the power electronics switch 20.

Figure 3:
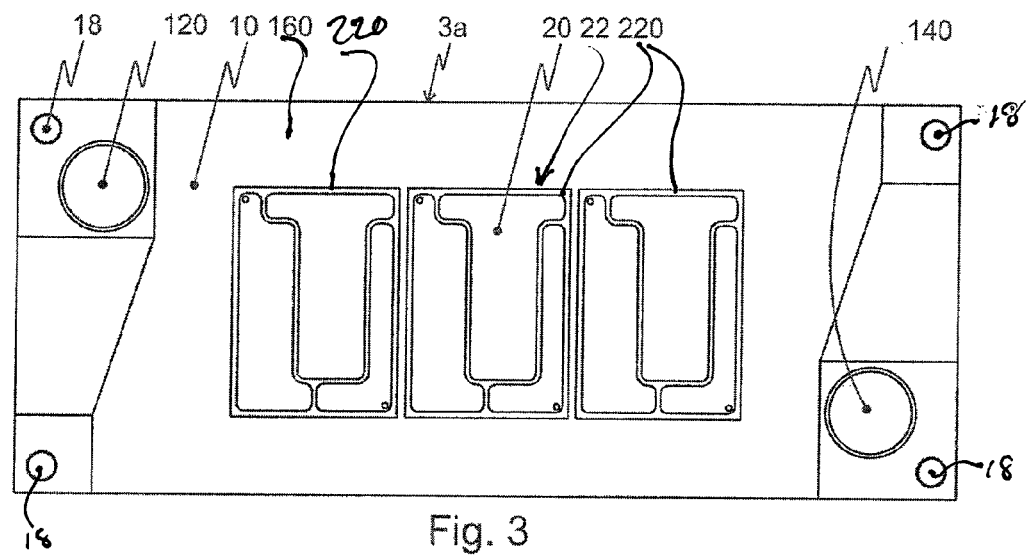
FIG. 3 shows a top plan view of a power semiconductor module which includes the inventive arrangement without a housing and of a corresponding capacitor from the direction of one main side of the module.

FIG. 3 shows a plan view of inventive power semiconductor module 1 without a housing, taken from the direction of main side 2a. In this case, the figure again shows a U-shaped cooling device 10 having a flow outflow 120 and a return outflow 140 in opposite corners of first main side 2a. In addition, each corner of cooling device 10 contains a recess 18 which extends through from first main side 2a to second main side 2b, is not connected to the cooling circulation and is used for connection to adjacent power semiconductor modules by use of screw joints to clamp the power semiconductor modules together through recesses 18.

FIG. 3 also shows a cooling face 160 on which three switching modules 220 of power electronics circuit 22 are arranged. The load connection devices extending from submodules 220 to longitudinal sides 3a/b are not shown, like auxiliary connection device 28 extending from these submodules 220 to a narrow side 4a/b.

Figure 4:
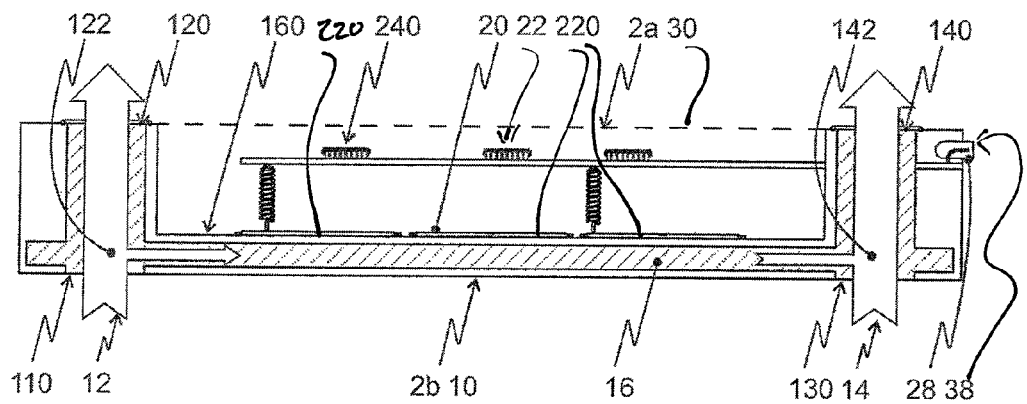
FIGS. 4 and 5 show a schematic cross-sections through an inventive power semiconductor module taken parallel to one longitudinal side, and a corresponding schematic cross-section of a capacitor of the inventive arrangement.
Figure 5:
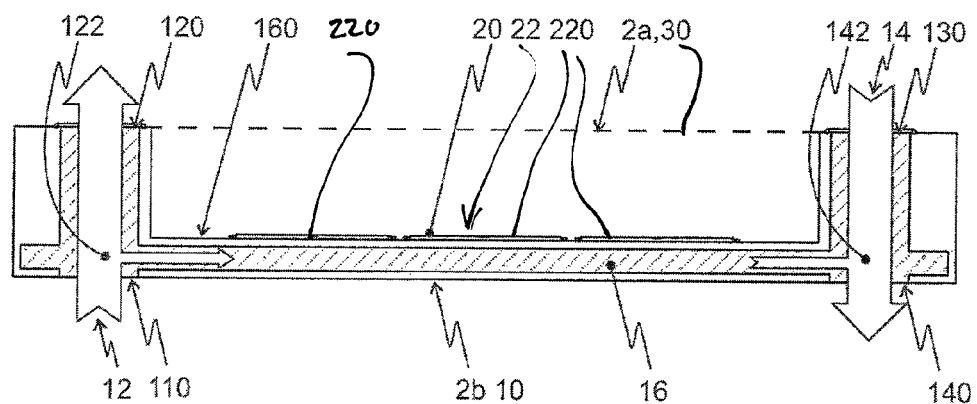

FIGS. 4 and 5 schematically show plan views of a section through a further power semiconductor module 1 according to the invention from the direction of longitudinal side 3a. These figures again show U-shaped cooling device which approximately completely forms a second main side 2b and also the two narrow sides 4a/b of power semiconductor module 1. Similarly, cooling device 10 forms a portion of first main side 2a, and portions of the two longitudinal sides 3a/b (cf., FIG. 1). The remaining portions of the first main side 2a and the remaining portions of the one narrow side 4a and both longitudinal sides 3a/b are formed by housing 30.

The interior of U-shaped cooling device 10 in this case contains three switching modules 220 of power electronics circuit 22 on a cooling face 160 of the cooling device 10, said switching modules being in thermal contact with the cooling fluid by means of cooling device 10. The cooling volume 16 of cooling device 10 also has a second cooling face 162, which simultaneously forms a portion of second main side 2b. By way of example, this second cooling face 162 is used for indirectly cooling a capacitor which is thermally linked thereto.

In the case of power semiconductor module 1, the cooling fluid of the flow 12 enters cooling device 10 through a flow inflow 110 on the second main side 2b and is split into two partial streams in said cooling device by means of a first branch 122. The greater portion of the cooling fluid leaves cooling device 10 of power semiconductor module 1 through a flow outflow 120 on first main side 2a, while a relatively small proportion of the cooling fluid flows through cooling volume 16 with adjacent to cooling face 160.

Second main side 2b likewise has a return inflow 130 arranged therein. The cooling fluid of a return 14 enters cooling device 10 through the latter and is combined at a second branch 142 with the cooling fluid which has flowed through cooling volume 16. Return 14 then leaves cooling device 10 through return outflow 140 on first main side 2a.

In addition, power semiconductor module 1 also has an internal control board 240 which, in a manner which is standard in the art, is connected by means of compliant circuitry to switching modules 220 and to power semiconductor components arranged thereon and provides driver functionality for power electronics circuit 22. Control connection 28 is part of internal control board 240 and power electronics switch 20 on one narrow side 4a of power semiconductor module 1, and protrudes through recess 38 in housing 30.

Essentially, FIG. 5 shows the identical power semiconductor module 1, the internal control board not being shown here, with identical connection devices. However, in this case the function of the connection devices is changed for cooling fluid, since return inflow 130 is arranged on the first main side 2a and return outflow 140 is arranged on second main side 2b. This is only a functional change rather than a structural change, however.

In principle, the power semiconductor module shown in FIGS. 4 and 5 is therefore suitable for different directions of flow for flow 12 and return 14. Given increased demands on the efficiency of the first, second or both branches, this suitability for any direction of flow can also be relinquished.

Figure 6:
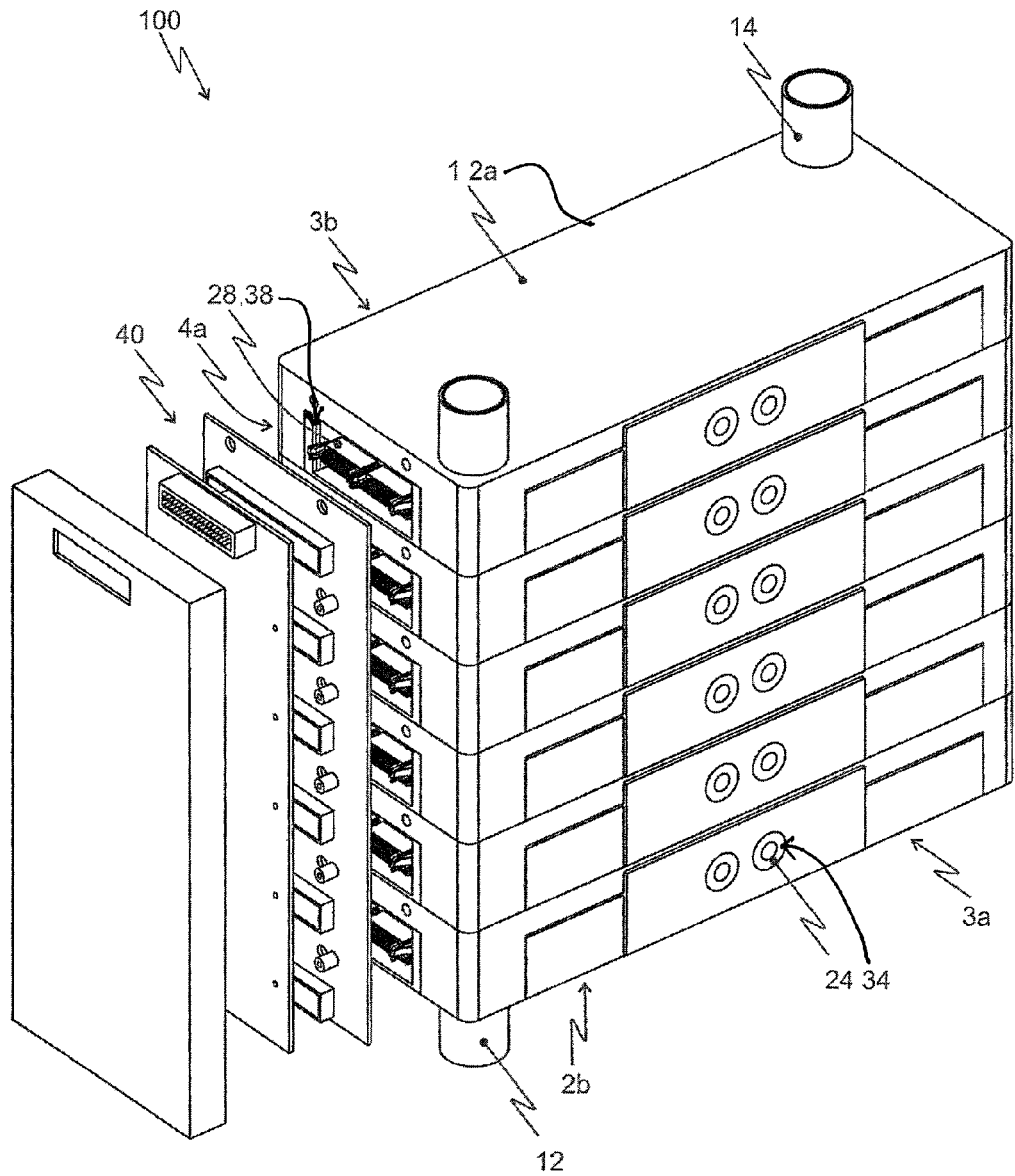
FIG. 6 shows a perspective view of a first embodiment of the inventive arrangement.

FIG. 6 shows a perspective view of a first embodiment of the inventive arrangement 100. The figure shows a plurality of modular power semiconductor modules 1, each with two connection devices for cooling fluid on opposite main sides 2a/b, with load connection devices 24 on longitudinal side 3a, a matching load connection device on longitudinal side 3b and with control connection devices 28 on the respective narrow sides 4a/b. The flow 12 and return 14 of the power semiconductor modules 1 are connected by the connection devices to form a cooling circulation. To this end, the flow inflow and the return inflow of one power semiconductor module are connected to the return outflow of the downstream power semiconductor module directly, exclusively with the additional arrangement of external seals between the associated connection devices that are to be connected.

In order to produce a connection that is impervious to fluid, the power semiconductor modules 1 are screwed together, cf. FIG. 3, or are connected by force fit by, e.g., a clamp or other locking device.

Load input connection devices 24, in this case the DC connection devices, are arranged on a first longitudinal side 3a and the load output connection devices, in this case the AC voltage connection devices, are arranged on the opposite longitudinal sides 3b and penetrate the respective housing at associated recesses. This embodiment produces enormous advantages for an inverter circuit that is to be produced, since the DC voltage side is therefore isolated from the AC voltage side. As a result, the connection to a DC voltage intermediate circuit may be provided on the DC voltage side in a compact and low-inductance fashion. Similarly, sufficient installation space means that the connection on the AC voltage side can be provided according to requirements.

Auxiliary connection devices 28 are provided on one narrow side 4a and therefore do not influence the configuration leeway for the load connections in any way. Auxiliary connection devices 28 are connected to a multipart external control board 40, which may possibly have a suitable dedicated housing for encapsulation that is impervious to dust and moisture, as shown.

Figure 7:
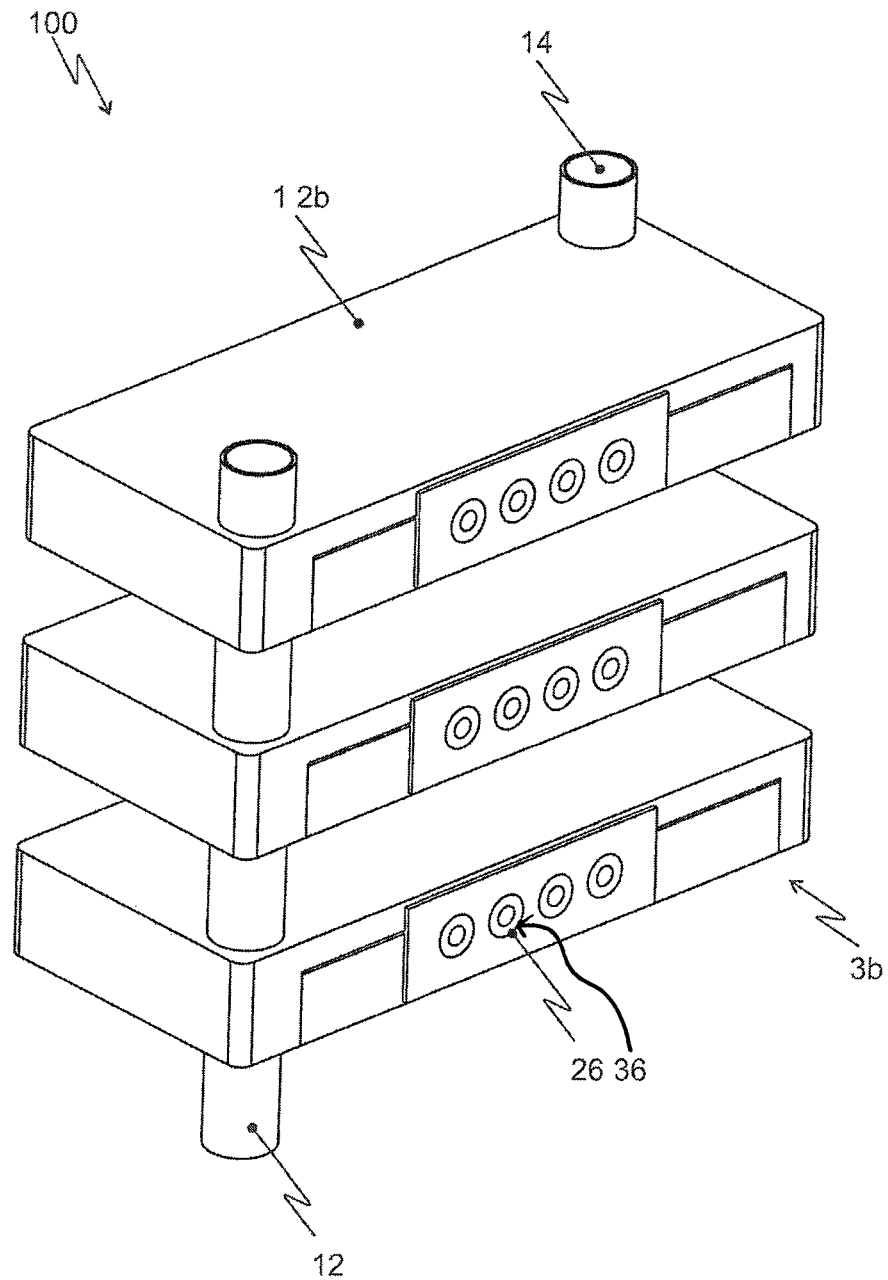
FIG. 7 shows a perspective view of a second embodiment of the inventive arrangement.

FIG. 7 shows a perspective view of a second embodiment of the inventive arrangement 100. The figure shows a plurality of modular power semiconductor modules 1, each with two connection devices for cooling fluid on opposite main sides and with load connection devices on the respective longitudinal sides 3*a/b*. The control connection devices on the respective narrow sides are not shown. The flow 12 and return 14 of power semiconductor modules 1 are connected by the connection devices to form a cooling circulation. To this end, the flow inflow and the return inflow of one power semiconductor module are connected to the return outflow of the downstream power semiconductor module indirectly, with the additional arrangement of sealing device and spacers, capable of carrying a flow, between the associated connection devices that are to be connected.

In order to form arrangement 100, preferably only the respective connections that are impervious to fluid are produced. This results in a network, which can be arranged in a retaining device—not shown. Alternatively, the power semiconductor modules 1 may be screwed together, possibly with the addition of necessary spacers, cf., FIG. 3.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module, having a basic parallelepipedal shape, the module comprising:
   two opposed main sides, two opposed longitudinal sides and two opposed narrow sides;
   a cooling device which is capable of carrying a flow of a cooling fluid;
   a power electronics switch; and
   a housing;
   wherein said cooling device includes a cooling volume having at least one cooling face and at least four connection devices for the cooling liquid, said at least four connection devices being arranged in pairs on said opposed main sides;
   wherein said connection devices include a flow inflow, a flow outflow, a return inflow and a return outflow;
   wherein said power electronics switch includes load connection devices which are respectively arranged on at least one of said longitudinal sides and also a control connection device which is arranged on a narrow side of the power semiconductor module; and
   wherein said housing covers a power electronics circuit of said power electronics switch and has recesses for said load and control connection devices;
   wherein said cooling device includes at least two opposed cooling faces;
   wherein said power electronics circuit includes at least two switching modules; and
   wherein two of said at least two switching modules are arranged on respective ones of said at least two opposed cooling faces of said cooling device.

2. The power semiconductor module of claim 1, wherein said housing is in the form of an encapsulation which encloses one or more of said power electronics circuit and said cooling device.

3. The power semiconductor module of claim 1, wherein said at least one cooling face of said cooling device is arranged substantially parallel to at least one of said main sides.

4. The power semiconductor module of claim 1,
   wherein said flow inflow and said return outflow are arranged on one of said main sides; and
   wherein said flow outflow and said return inflow are arranged on a second of said main sides.

5. The power semiconductor module of 4, wherein
   a first branch is arranged between said flow inflow and said flow outflow and a second branch is arranged between said return inflow and said return outflow;
   said first and second branches being in fluid communication so that said cooling volume is able to carry a portion of said cooling fluid from said flow inflow to said return outflow.

6. The power semiconductor module of claim 1,
   wherein said flow inflow and said return inflow are arranged on one of said main sides; and
   wherein said flow outflow and said return outflow are arranged on a second of said main sides.

7. An arrangement comprising a plurality of power semiconductor modules of claim 1, wherein the power semiconductor modules are strung together in modular fashion by connecting said flow outflow of a first power semiconductor module to said flow inflow of a second power semiconductor module adjacent to said first power semiconductor module, and connecting said return inflow of said first power semiconductor module to said return outflow of said second power semiconductor module.

8. The arrangement of claim 7, wherein
   said load connection devices include a load input connection device and a load output connection device arranged on the same longitudinal side of each of said plurality of power semiconductor modules.

9. The arrangement of claim 7, wherein
   said control connection devices of each of said power semiconductor modules are arranged on the same narrow side thereof.

10. The arrangement of claim 7, wherein
    at least two control connection devices of adjacent power semiconductor modules are connected to a common external control board.

11. The arrangement of claim 10, wherein
    those power semiconductor modules which have control connection devices connected by means of said common external control board are associated with one electrical phase of an AC system.

12. An arrangement comprising a plurality of power semiconductor modules of claim 1, wherein the power semiconductor modules are strung together in modular fashion by connecting said flow outflow of a first power semiconductor module to said flow inflow of a second power semiconductor module adjacent to said first power semiconductor module, and by connecting said return outflow of said first power semiconductor module to said return inflow of said second power semiconductor module.

13. The arrangement of claim 12, wherein
said load connection devices include a load input connection device and a load output connection device arranged on the same longitudinal side of each of said power semiconductor modules.

14. The arrangement of claim 12, wherein
said control connection devices of each of said power semiconductor modules are arranged on the same narrow side thereof.

15. The arrangement of claim 12, wherein
at least two control connection devices of adjacent power semiconductor modules are connected to a common external control board.

16. The arrangement of claim 15, wherein
those power semiconductor modules which have control connection devices connected by means of said common external control board are associated with one electrical phase of an AC system.

\* \* \* \* \*